US010830858B2

(12) United States Patent
Shi et al.

(10) Patent No.: US 10,830,858 B2
(45) Date of Patent: Nov. 10, 2020

(54) CORRECTING TIME

(71) Applicant: Shanghai Neusoft Medical Technology Co., Ltd., Shanghai (CN)

(72) Inventors: Jianhua Shi, Shenyang (CN); Qin Xu, Shenyang (CN); Rong Sun, Shenyang (CN); Haiquan Li, Shenyang (CN); Yan Wang, Shenyang (CN); Lin Wu, Shenyang (CN); Junwei Shang, Shenyang (CN)

(73) Assignee: Shanghai Neusoft Medical Technology Co., Ltd., Shanghai (CN)

( * ) Notice: Subject to any disclaimer, the term of this patent is extended or adjusted under 35 U.S.C. 154(b) by 525 days.

(21) Appl. No.: 15/683,418

(22) Filed: Aug. 22, 2017

(65) Prior Publication Data

US 2018/0059203 A1    Mar. 1, 2018

(30) Foreign Application Priority Data

Aug. 24, 2016  (CN) ............................ 2016 1 0717525

(51) Int. Cl.
*G01R 33/58* (2006.01)
*G01R 33/54* (2006.01)
(Continued)

(52) U.S. Cl.
CPC ....... *G01R 33/583* (2013.01); *G01R 33/3852* (2013.01); *G01R 33/543* (2013.01); *G01R 33/56572* (2013.01)

(58) Field of Classification Search
CPC ............ G01R 33/543; G01R 33/56572; G01R 33/583; G01R 33/3852; G01R 33/56
See application file for complete search history.

(56) References Cited

U.S. PATENT DOCUMENTS

| 2013/0285664 A1* | 10/2013 | Scheel | G01R 33/3852 324/319 |
| 2014/0167751 A1* | 6/2014 | He | G01R 33/56572 324/307 |
| 2015/0008920 A1* | 1/2015 | Lee | G01R 33/443 324/309 |

FOREIGN PATENT DOCUMENTS

| CN | 101162262 A | 4/2008 |
| CN | 102096054 A | 6/2011 |

(Continued)

OTHER PUBLICATIONS

English translation of CN102096054 provided by Espacenet. English translation obtained Feb. 18, 2020 (Year: 2020).*

(Continued)

*Primary Examiner* — Rishi R Patel
(74) *Attorney, Agent, or Firm* — Fish & Richardson P.C.

(57) ABSTRACT

Methods, systems, and computer-readable storage mediums for correcting time in a nuclear magnetic resonance device are provided. In one aspect, a method includes obtaining respective transmission time delays of three gradient pulse signals that are generated by a three-dimensional gradient subsystem of the nuclear magnetic resonance device and include a slice-selection gradient signal, a phase-encoding gradient signal, and a frequency-encoding gradient signal, determining a time correction value according to the obtained respective transmission time delays of the three gradient pulse signals, and correcting a respective output time of each of the three gradient pulse signals, an output time of a radio-frequency (RF) pulse signal generated by a RF transmitting subsystem of the nuclear magnetic resonance device, and a reception time of a magnetic resonance signal received by a RF receiving subsystem in a scanning cycle according to the determined time correction value.

20 Claims, 4 Drawing Sheets

(51) Int. Cl.
G01R 33/565 (2006.01)
G01R 33/385 (2006.01)

(56) References Cited

FOREIGN PATENT DOCUMENTS

| | | |
|---|---|---|
| CN | 102156270 A | 8/2011 |
| CN | 103885015 A | 6/2014 |
| CN | 105005012 A | 10/2015 |
| WO | 2016081677 A1 | 5/2016 |

OTHER PUBLICATIONS

English translation of CN102156270A provided by Espacenet (Year: 2020).*
State Intellectual Property Office of the People's Republic of China, Office Action and Search Report Issued in Application No. 201610717525.6, Sep. 21, 2018, 5 pages, (Submitted with Machine Translation).

* cited by examiner

CORRECTING TIME

CROSS REFERENCE TO RELATED APPLICATIONS

This application claims priority to Chinese Patent Application No. 201610717525.6 entitled "Method, Apparatus and Device for Correcting Time" and filed on Aug. 24, 2016, the entire content of which is incorporated herein by reference.

TECHNICAL FIELD

The present disclosure relates to nuclear magnetic resonance fields, and more particularly to correcting time in a nuclear magnetic resonance device.

BACKGROUND

Nuclear Magnetic Resonance Imaging (NMRI, also referred to as MRI) is a mature imaging technique at present. The MRI has advantages such as no electromagnetic radiation, high image contrast and tomography achieved in any direction, and has become one of the main imaging methods in medical science fields and scientific research fields. In some cases, due to influence of physical hardware in a nuclear magnetic resonance device, time delays among signals in scanning cycles occur, which can cause artifacts in an MRI image and affect diagnosis results.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

The present disclosure provides methods, systems, and computer-readable mediums for correcting time in a nuclear magnetic resonance device, which can weaken or even eliminate artifacts in a nuclear magnetic resonance image and thereby improve accuracy of diagnosis results.

In general, one innovative aspect of the subject matter described in the present disclosure can be embodied in methods that include the actions of obtaining, by one or more processors in the nuclear magnetic resonance device, respective transmission time delays of three gradient pulse signals generated by a three-dimensional gradient subsystem of the nuclear magnetic resonance device, the three gradient pulse signals including a slice-selection gradient signal, a phase-encoding gradient signal, and a frequency-encoding gradient signal; determining, by the one or more processors, a time correction value according to the obtained respective transmission time delays of the three gradient pulse signals; and correcting, by the one or more processors and according to the determined time correction value, a respective output time of each of the three gradient pulse signals, an output time of a radio-frequency (RF) pulse signal generated by a RF transmitting subsystem of the nuclear magnetic resonance device, and a reception time of a magnetic resonance signal received by a RF receiving subsystem in a scanning cycle.

Other embodiments of this aspect include corresponding computer systems, apparatus, and computer programs recorded on one or more computer storage devices, each configured to perform the actions of the methods. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The foregoing and other embodiments can each optionally include one or more of the following features, alone or in combination. For example, obtaining the transmission time delays of the gradient pulse signals can include: for each of the gradient pulse signals, determining a theoretical time of a central point of the magnetic resonance signal on an assumption that the transmission time delay of the gradient pulse signal is zero; acquiring an actual time of the central point of the magnetic resonance signal obtained by performing scanning according to the gradient pulse signal; and determining a difference between the actual time and the theoretical time to be the transmission time delay of the gradient pulse signal.

In some examples, in the scanning cycle, the radio frequency pulse signal includes a 90-degree RF pulse signal and a 180-degree RF pulse signal. Determining the theoretical time of the central point of the magnetic resonance signal can include: obtaining a first output time of the 90-degree RF pulse signal and a second output time of the 180-degree RF pulse signal; calculating a time difference between the first output time of the 90-degree RF pulse signal and the second output time of the 180-degree RF pulse signal; and determining the theoretical time of the central point of the magnetic resonance signal according to the output time of the 180-degree RF pulse signal and the time difference.

In some cases, determining the time correction value according to the transmission time delays of the respectively gradient pulse signals includes selecting a largest transmission time delay from the transmission time delays of the three respective gradient pulse signals as the time correction value. In some cases, determining the time correction value according to the transmission time delays of the respectively gradient pulse signals includes selecting a smallest transmission time delay from the transmission time delays of the three respective gradient pulse signals as the time correction value.

In some cases, determining the time correction value according to the transmission time delays of the respectively gradient pulse signals includes: weighting the transmission time delays of the three respective gradient pulse signals according to preset coefficients; obtaining a weighted value by adding together the weighted transmission time delays; and taking the weighted value as the time correction value.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

A fundamental principle of an MRI can be as follows: first, an object such as a human body is exposed to a special magnetic field, and the object's hydrogen nuclei align with the magnetic field and create a net magnetic moment. Next, a radio frequency (RF) pulse with a specific frequency is applied perpendicular to the magnetic field to induce a resonance of the hydrogen nuclei, which causes the net magnetic moment to tilt away from the magnetic field. Once the RF pulse is removed, the hydrogen nuclei realign themselves such that their net magnetic moment is again parallel with the magnetic field. This returns to equilibrium is referred to as relaxation. During the relaxation, the hydrogen nuclei lose energy by emitting their own RF pulse signal with the specific frequency, that is, a magnetic resonance signal. The magnetic resonance signal can be measured by a conductive field placed around the object being imaged. This measurement can be processed or reconstructed to obtain an MRI image.

In some implementations, an MRI system has three subsystems including a three-dimensional gradient subsystem, an RF transmitting subsystem, and an RF receiving subsystem. The three-dimensional gradient subsystem includes a gradient generator, a gradient amplifier, and a gradient coil. The three-dimensional gradient generator is configured to generate three gradient pulse signals (also referred to as three-dimensional gradient pulse signals), where the three gradient pulse signals include a slice-selection gradient signal, a frequency-encoding gradient signal and a phase-encoding gradient signal. The gradient amplifier is configured to amplify the three gradient pulse signals. The gradient coil is configured to generate a three-dimensional gradient magnetic field by using the amplified three gradient pulse signals, where the three-dimensional gradient magnetic field can be used to make an image with spatial information. The RF transmitting subsystem is configured to generate and transmit an RF pulse signal. And the RF receiving subsystem is configured to receive a magnetic resonance signal.

Figure 1A:
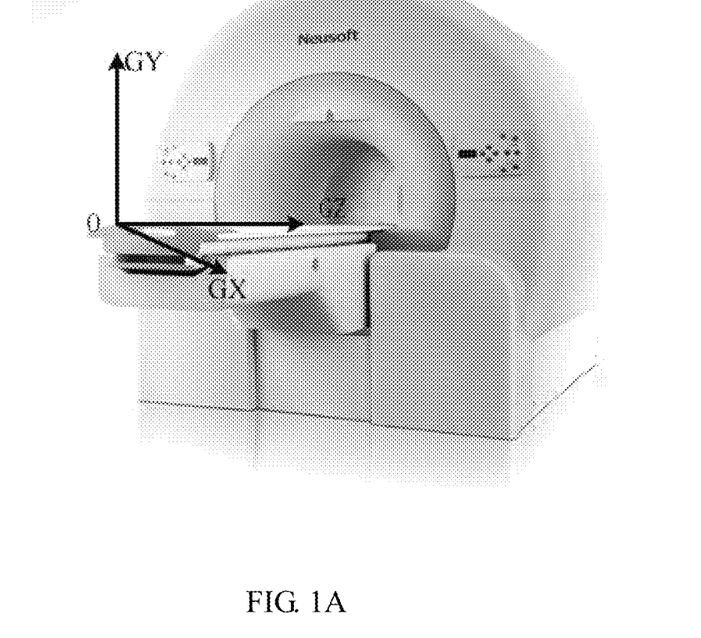
FIG. 1A is a stereogram of a nuclear magnetic resonance device according to an example of the present disclosure.
Figure 1B:
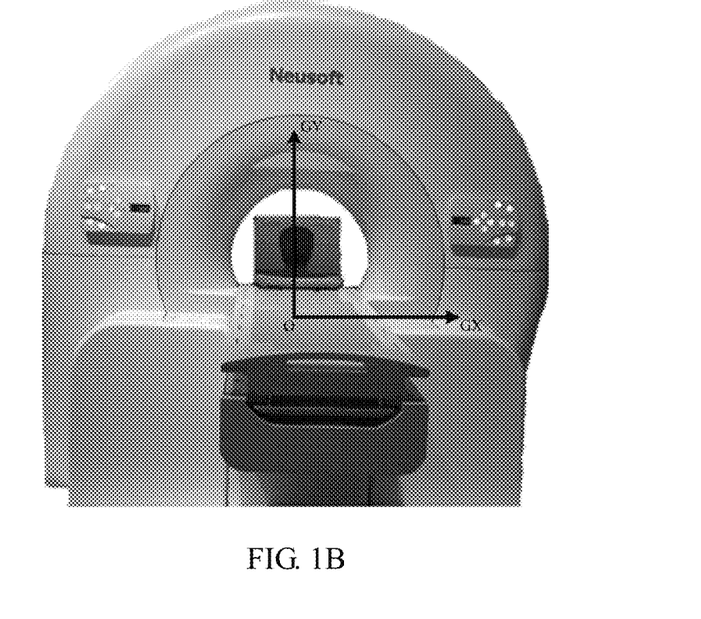
FIG. 1B is a side view of a nuclear magnetic resonance device according to an example of the present disclosure.

It should be noted that for three gradient pulse signals (also referred to as three dimensional gradient pulse signals), i.e., a slice-selection gradient signal, a frequency-encoding gradient signal and a phase-encoding gradient signal, directions corresponding to the three gradient pulse signals may be any three directions perpendicular to each other. In an example, referring to FIGS. 1A and 1B, the slice-selection gradient signal is set in a forward direction (i.e., a GZ axis direction), the frequency-encoding gradient signal is set in a horizontal direction (i.e., GX axis direction), and the phase-encoding gradient signal is set in a direction (i.e., GY axis direction) perpendicular to the forward direction and the horizontal direction. It should be understood that FIGS. 1A and 1B cannot limit the present disclosure. To make the description clearer, the following examples are described based on FIGS. 1A and 1B.

To obtain an accurate reconstructed image, in a scanning cycle, time reference points of three gradient pulse signals generated by the three-dimensional gradient subsystem, a time reference point of a RF pulse signal generated by the RF transmitting subsystem and a time reference point of a magnetic resonance signal received by the RF receiving subsystem should be same with each other. However, due to influence of physical hardware in the three-dimensional gradient subsystem, transmission time delays of the three gradient pulse signals occur, thus, the time reference points of the three gradient pulse signals in the scanning cycle can be respectively different from the time reference point of the RF pulse signal and the time reference point of the magnetic resonance signal, which can cause that artifacts occur in a obtained nuclear magnetic resonance image, thereby affecting diagnosis results.

Figure 2:
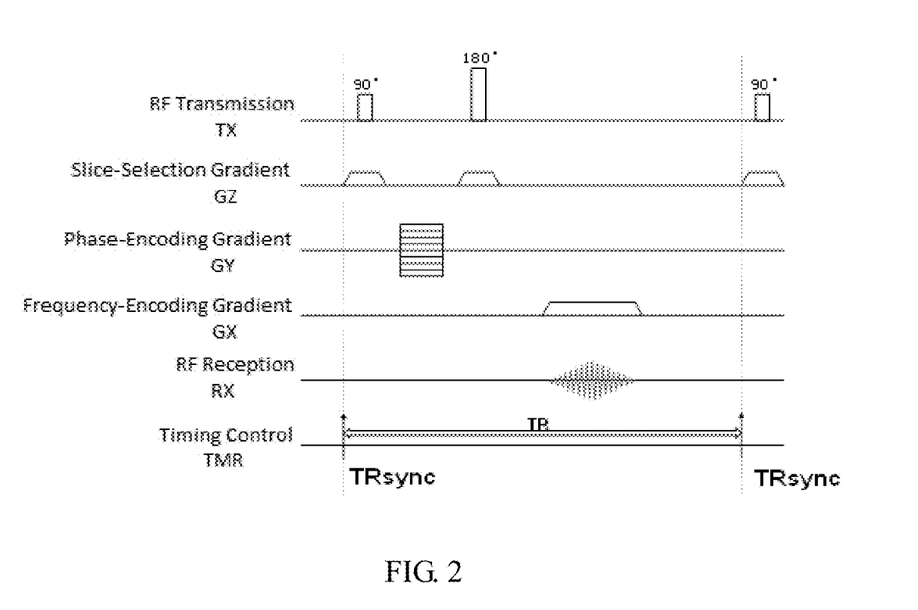
FIG. 2 is a schematic diagram illustrating that time reference points of gradient pulse signals, an RF pulse signal TX and a magnetic resonance signal RX are ideally same with each other in a scanning cycle.

FIG. 2 is a schematic diagram illustrating time sequences in an ideal case, where time reference points of the gradient pulse signals, a time reference point of an RF pulse signal TX and a time reference of a magnetic resonance signal RX are the same with each other in a scanning cycle (e.g., Time of Repetition (TR) of pulse). The RF pulse signal TX generated by the RF transmitting subsystem may include two RF pulse signals with different amplitudes in a TR, which have phases of 90 and 180 degrees, respectively. The three-dimensional gradient generator generates two slice-selection gradient signals, a linear phase-encoding gradient signal and a frequency-encoding gradient signal in the TR. As an example, the phase-encoding gradient signal in FIG. 2 corresponds to a plurality of rectangular waveforms, which indicates that each TR corresponds to one rectangular waveform, and a plurality of TRs correspond to a plurality of rectangular waveforms in an amplitude increasing or decreasing order, respectively. The RF receiving subsystem receives a magnetic resonance signal in the TR.

Figure 3:
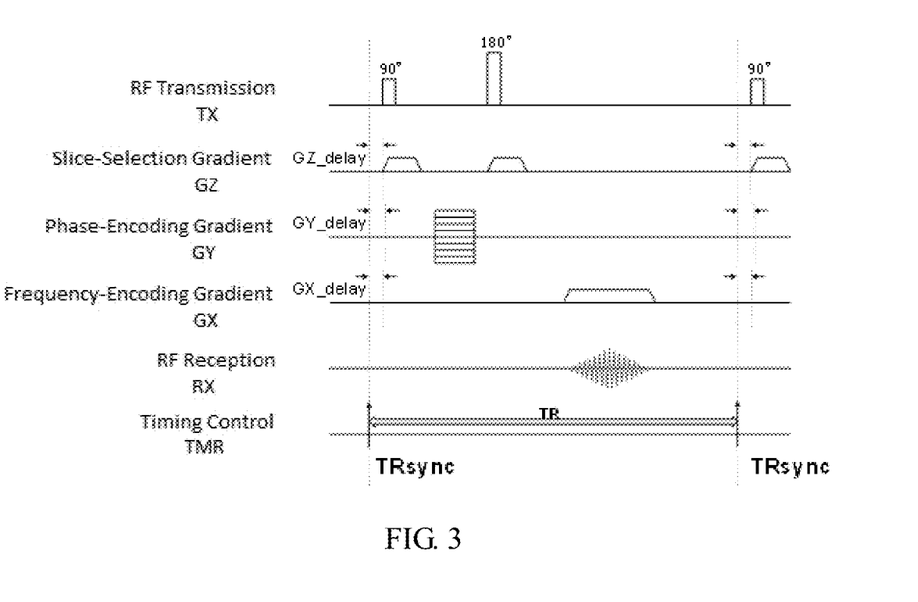
FIG. 3 is a schematic diagram illustrating that transmission time delays of gradient pulse signals occur.

In some examples, the transmission time delays of the gradient pulse signals occur when the gradient pulse signals are transmitted in the three-dimensional gradient subsystem, and time lengths of the transmission time delays of the gradient pulse signals in various directions may be different from each other. FIG. 3 is a schematic diagram illustrating that the transmission time delays of the gradient pulse signals occur. The time reference point of the RF pulse signal TX and the time reference point of the magnetic resonance signal RX can be taken as a reference. In the example, a transmission time delay of the RF pulse signal and a transmission time delay of the magnetic resonance signal are too small to be considered, thus, only time lengths of the transmission time delays of the three gradient pulse signals are considered. GZ_delay expresses a transmission time delay of the slice-selection gradient signal, GY_delay expresses a transmission time delay of the phase-encoding gradient signal, and GX_delay expresses a transmission time delay of the frequency-encoding gradient signal, where a largest transmission time delay is GY_delay, and a smallest transmission time delay is GZ_delay.

Since the time reference points of the gradient pulse signals are respectively different from the time reference points of the other two signals, it can cause artifacts in the obtained image.

To overcome the technical problem, implementations of the present disclosure provide a method of correcting time as well as a nuclear magnetic resonance device. In the method, a target delay is obtained according to transmission time delays of the respective gradient pulse signals; the target delay is taken as a reference delay; and the RF pulse signal TX, the magnetic resonance signal RX as well as the gradient pulse signals with different time lengths of the transmission time delays are corrected.

To provide a better understanding of the technical solutions of the present disclosure to those skilled in the art, the technical solutions of embodiments of the present disclosure will be described clearly and fully below in combination with the drawings in the embodiments of the present disclosure. It is apparent that the described embodiments are merely part of embodiments of the present disclosure rather than all embodiments. Other embodiments achieved by those of ordinary skill in the art based on the embodiments in the present disclosure without paying creative work shall all fall into the scope of protection of the present disclosure.

Figure 4:
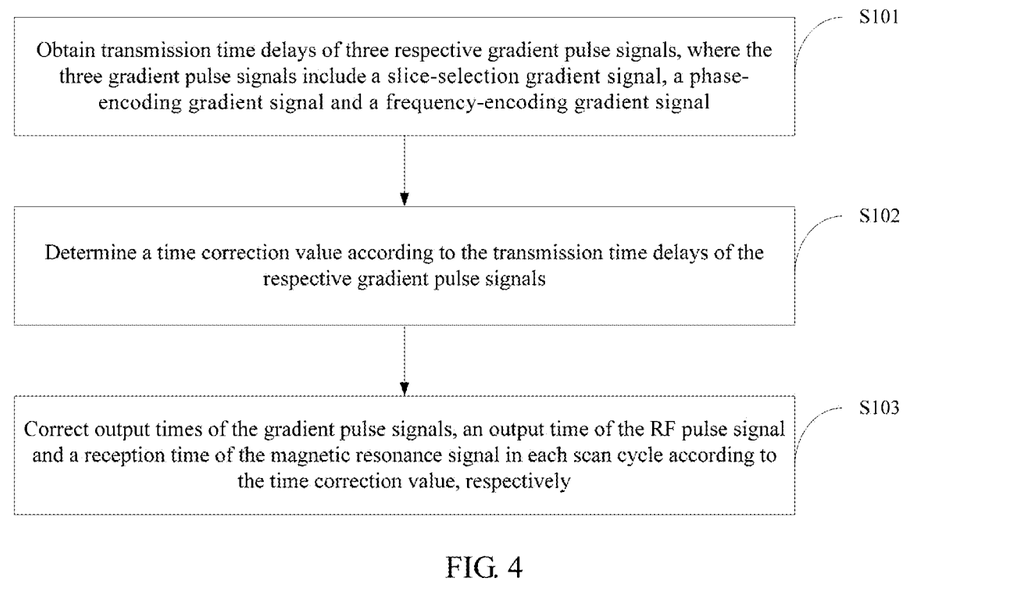
FIG. 4 is a flowchart illustrating a method of correcting time according to an example of the present disclosure.

FIG. 4 is a flowchart illustrating a method of correcting time according to an example of the present disclosure. According to the example, the method includes procedures as follows.

At step S101, respective transmission time delays of three gradient pulse signals are obtained. The three gradient pulse signals include a slice-selection gradient signal, a phase-encoding gradient signal and a frequency-encoding gradient signal, which correspond to a slice-selection dimension, a phase dimension, and a frequency dimension, respectively.

In a scanning cycle, a gradient pulse signal in each direction corresponds to a transmission time delay, and transmission time delays of gradient pulse signals in a same direction are the same with each other. For example, referring to FIG. 3, two slice-selection gradient signals are transmitted in a TR. Since transmission paths of the two slice-selection gradient signals in the three-dimensional gradient subsystem are the same, the transmission time delays of the two slice-selection gradient signals are the same, accordingly.

Figure 5:
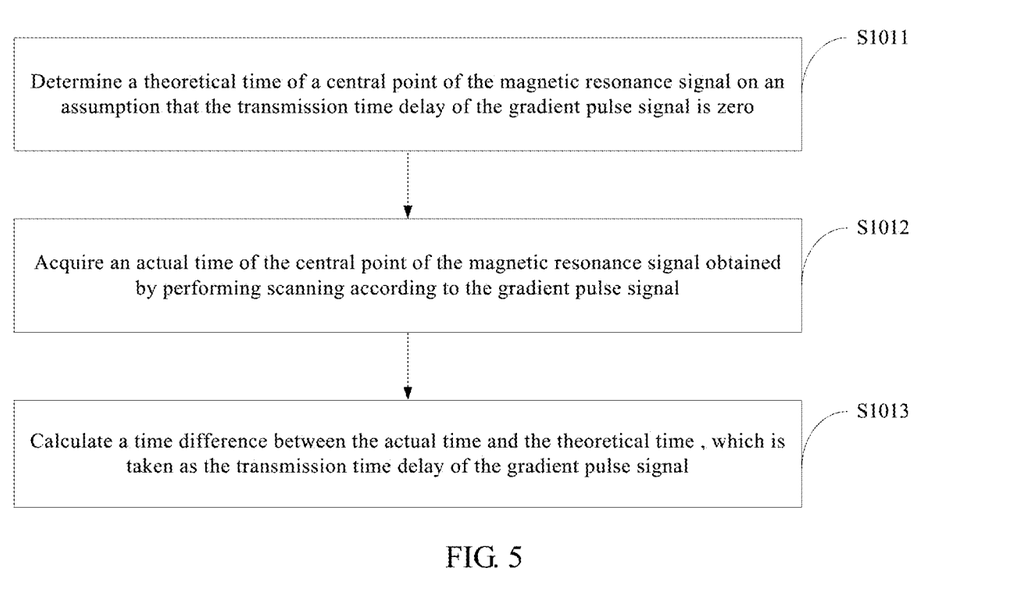
FIG. 5 is a flowchart illustrating a method of obtaining transmission time delays of respective gradient pulse signals according to an example of the present disclosure.

Referring to FIG. 5, in the example, for each of the three gradient pulse signals, a transmission delay of the gradient pulse signal may be determined in steps S1011 to S1013.

At step S1011, a theoretical time of a central point of the magnetic resonance signal is determined on an assumption that the transmission time delay of the gradient pulse signal is zero.

There are different methods of calculating the theoretical time point of the central point of the magnetic resonance signal. A method to be used can be determined according to a type of a pulse sequence. For example, a spin-echo sequence is a pulse signal combination for magnetic resonance imaging, which can be abbreviated as a SE sequence.

The RF transmitting subsystem can transmit a 90-degree RF pulse signal and a 180-degree RF pulse signal in a scanning cycle. The theoretical time of the central point of the magnetic resonance signal may be calculated by obtaining an output time t1 of the 90-degree RF pulse signal and an output time t2 of the 180-degree RF pulse signal and calculating a time difference (i.e., t2−t1) between the output time of the 180-degree RF pulse signal and the output time of the 90-degree RF pulse signal. In some cases, a time difference between the theoretical time of the central point of the magnetic resonance signal and the output time of the 180-degree RF pulse signal is equal to the time difference between the output time of the 180-degree RF pulse signal and the output time of the 90-degree RF pulse signal. That is, the theoretical time of the central point of the magnetic resonance signal can be determined to be t2+t2−t1 according to the output time of the 180-degree RF pulse signal and the time difference (i.e., t2−t1).

At step S1012, an actual time of the central point of the magnetic resonance signal is acquired, where the magnetic resonance signal is obtained by performing scanning according to the gradient pulse signal.

In the example, the three gradient pulse signals are sequentially transmitted, the scanning are performed at least three times to collect magnetic resonance signals corresponding to the gradient pulse signals in different dimensions, and the actual time of the central point of each of magnetic resonance signals is determined. For example, under the premise of loading the RF pulse signal, the slice-selection gradient signal is transmitted individually, and the scanning is performed to obtain a first magnetic resonance signal. After the transmission of the slice-selection gradient signal is stopped, the phase-encoding gradient signal is transmitted individually, and the scanning is performed to obtain a second magnetic resonance signal. After the transmission of the phase-encoding gradient signal is stopped, the frequency-encoding gradient signal is transmitted individually, and the scanning is performed to obtain a third magnetic resonance signal. In an example, the scanning is performed once according to the gradient pulse signal in each direction. In another example, to make the obtained actual time of the central point more accurate, the scanning may be performed a plurality of times according to the gradient pulse signal in each direction to obtain a plurality of magnetic resonance signals, and a mean of actual time values of central points of the plurality of magnetic resonance signals is taken as the actual time of the central point of the magnetic resonance signal.

At step S1013, a time difference between the actual time and the theoretical time is calculated, which is taken as the transmission time delay of the gradient pulse signal.

In an example, the theoretical time is T0, the actual time of the central point of the magnetic resonance signal corresponding to the slice-selection gradient signal is T1, the actual time of the central point of the magnetic resonance signal corresponding to the phase-encoding gradient signal is T2, and the actual time of the central point of the magnetic resonance signal corresponding to the frequency-encoding gradient signal is T3. Thus, a time length of the transmission time delay corresponding to the slice-selection gradient signal is T1−T0, a time length of the transmission time delay corresponding to the phase-encoding gradient signal is T2−T0, and a time length of the transmission time delay corresponding to the frequency-encoding gradient signal is T3−T0.

In an example, in FIGS. 2 and 3, the RF transmitting subsystem transmits a 90-degree RF pulse signal and a 180-degree RF pulse signal. However, in practical applications, there may be more than one 180-degree RF pulse signals, and different 180-degree RF pulse signals may be generated in different time points in a scanning cycle. In this case, when steps S1011 to S1013 are executed, one of the 180-degree RF pulse signals may be selected for related calculation.

After the transmission time delays of the three respective gradient pulse signals are obtained in step S101, step S102 is executed.

Referring back to FIG. 4, at step S102, a time correction value is determined according to the transmission time delays of the respective gradient pulse signals.

In the example, the time correction value is used to correct time when the three-dimensional gradient subsystem transmits each of the gradient pulse signals, to correct time when the RF transmitting subsystem transmits the RF pulse signal, and to correct time when the RF receiving subsystem receives the magnetic resonance signal.

In an example, the largest one of the transmission time delays corresponding to the three respective gradient pulse signals may be taken as the time correction value. Alternatively, the smallest one of the respective transmission delays may be taken as the time correction value. Alternatively, the transmission time delays of the three respective gradient pulse signals are weighted according to preset coefficients, a weighted value is obtained by adding together the weighted transmission time delays, and the weighted value may be taken as the time correction value. If the weighting coefficients of the various transmission time delays are the same with each other, it is equivalent to obtaining a mean value of the transmission time delays.

At step S103, according to the time correction value, an output time of each of the gradient pulse signals, an output time of the RF pulse signal and a reception time of the magnetic resonance signal in each scan cycle are corrected, respectively.

After the time correction value is obtained, according to the time correction value, the output time of each of the three gradient pulse signals, the output time of the RF pulse signal and the reception time of the magnetic resonance signal may be respectively delayed by corresponding time lengths, so as to implement correction. For example, assuming that the time correction value is the largest transmission time delay, e.g., the transmission time delay GY_delay of the phase-encoding gradient signal as illustrated in FIG. 3, the output time of the RF pulse signal and the reception time of the magnetic resonance signal are delayed by GY_delay; the output time of the slice-selection gradient signal is delayed by GY_delay-GZ_delay, the output time of the frequency-encoding gradient signal is delayed by GY_delay-GX_delay, and the output time of the phase-encoding gradient signal is delayed by 0.

As noted above, the three-dimensional gradient subsystem can include a gradient generator, a gradient amplifier and a gradient coil. The three-dimensional gradient generator is configured to generate the three gradient pulse signals. In an example, a host device may transmit a first delay signal to the gradient generator, where the first delay signal includes output time delays respectively corresponding to the three gradient pulse signals.

The RF transmitting subsystem can include an RF pulse generator, an RF amplifier, and an RF transmitting coil. The RF pulse generator is configured to generate the RF pulse signal. The RF amplifier is configured to amplify the RF pulse signal. And the RF transmitting coil is configured to transmit the RF pulse signal. In an example, the host device may transmit a second delay signal to the RF pulse generator, where the second delay signal includes an output time delay corresponding to the RF pulse signal.

The RF receiving subsystem can include an RF receiving coil and an RF receiver. The RF receiving coil is configured to receive the magnetic resonance signal. The RF receiver is configured to process the magnetic resonance signal to obtain an image. In an example, the host device transmits a third delay signal to the RF receiver, where the third delay signal includes a reception time delay corresponding to the magnetic resonance signal.

In the example, the transmission time delays of the three respective gradient pulse signals are obtained, and a time correction value is determined according to the transmission time delays of the three gradient pulse signals. And the respective output time of each of the three-dimensional gradient pulse signals, the output time of the RF pulse signal and the reception time of the magnetic resonance signal in each scanning cycle are corrected according to the time correction value, respectively. Thus, artifacts in a nuclear magnetic resonance image can be weakened and even eliminated, thereby improving accuracy of diagnosis results.

Based on the method of correcting time according to the examples above, the present disclosure further provides a logic for correcting time. Principles of the logic are described below in detail, taken in conjunction with the accompanying drawings.

Figure 6:
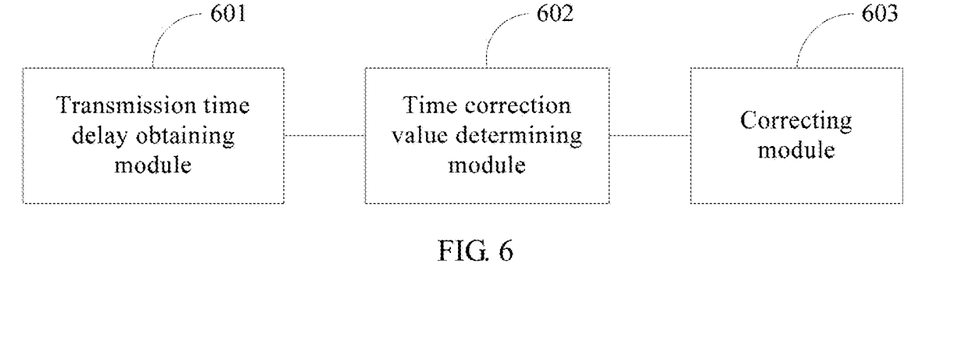
FIG. 6 is a schematic diagram illustrating a structure of a logic for correcting time according to an example of the present disclosure.

FIG. 6 is schematic diagram illustrating a structure of a logic for correcting time according to an example of the present disclosure. As shown in FIG. 6, functionally divided, the logic for correcting time above may include a transmission time delay obtaining module 601, a time correction value determining module 602, and a correcting module 603.

The transmission delay obtaining module 601 is configured to obtain respective transmission time delays of three gradient pulse signals, where the three gradient pulse signals include a slice-selection gradient signal, a phase-encoding gradient signal and a frequency-encoding gradient signal.

The time correction value determining module 602 is configured to determine a time correction value according to the transmission time delays of the respective gradient pulse signals.

The correcting module 603 is configured to correct a respective output time of each of the respective gradient pulse signals, an output time of a radio frequency pulse signal and a reception time of a magnetic resonance signal in each scanning cycle according to the time correction value.

In the example, the transmission time delays of the three respective gradient pulse signals are obtained, and a time correction value is determined according to the transmission time delays of the three gradient pulse signals. And, the output time of each of the three-dimensional gradient pulse signals, the output time of the RF pulse signal and the reception time of the magnetic resonance signal in each scanning cycle are corrected according to the time correction value, respectively. Thus, artifacts in a nuclear magnetic resonance image can be weakened and even eliminated, thereby improving accuracy of diagnosis results.

In some examples, the transmission delay obtaining module 601 includes: a theoretical time determining sub-module, an actual time obtaining sub-module, and a transmission time delay calculating sub-module. For each of the gradient pulse signals, the theoretical time determining sub-module is configured to determine a theoretical time of a central point of the magnetic resonance signal on an assumption that the transmission time delay of the gradient pulse signal is zero. The actual time obtaining sub-module is configured to acquire an actual time of the central point of the magnetic resonance signal obtained by performing scanning according to the gradient pulse signal. The transmission time delay calculating sub-module is configured to calculate a difference between the actual time and the theoretical time and take the difference as the transmission time delay of the gradient pulse signal.

In the scanning cycle, the radio frequency pulse signal can include a 90-degree radio frequency pulse signal and a 180-degree radio frequency pulse signal.

In some examples, the theoretical time determining sub-module includes: an output time obtaining unit, a time difference calculating unit, and a theoretical time determining unit.

The output time obtaining unit is configured to obtain an output time of the 90-degree radio frequency pulse signal and an output time of the 180-degree radio frequency pulse signal. The time difference calculating unit is configured to calculate a time difference between the output time of the 90-degree radio frequency pulse signal and the output time of the 180-degree radio frequency pulse signal. The theoretical time determining unit is configured to obtain the theoretical time of the central point of the magnetic resonance signal according to the output time of the 180-degree radio frequency pulse signal and the time difference.

In an example, the time correction value determining module 602 is configured to select the largest transmission time delay from the transmission time delays of the three respective gradient pulse signals as the time correction value.

In an example, the time correction value determining module 602 is configured to select the smallest transmission time delay from the transmission time delays of the three respective gradient pulse signals as the time correction value.

In an example, the time correction value determining module 602 is configured to: weight the transmission time delays of the three respective gradient pulse signals according to preset coefficients, obtain a weighted value by adding together the weighted transmission time delays, and take the weighted value as the time correction value.

The logic for correcting time according to an example of the present disclosure may apply to a nuclear magnetic resonance device or an electronic device with a processor (e.g., a time correcting processor). The electronic device may be an existing electronic device, an electronic device being under development, or an electronic device to be developed in further, which includes, but not limited to, desk computers, laptop computers and mobile terminals (including smart phones, non-smart phones and different tablet computers) existing at present, being under development or to be developed. In an example, a device may be implemented by software or by hardware or combination of software and hardware. Taking implementation by software as an example, the device is formed by reading corresponding computer program instructions in a storage medium into a memory and executing the computer program instructions by a processor of a nuclear magnetic resonance device or an electronic device with the processor.

Figure 7:
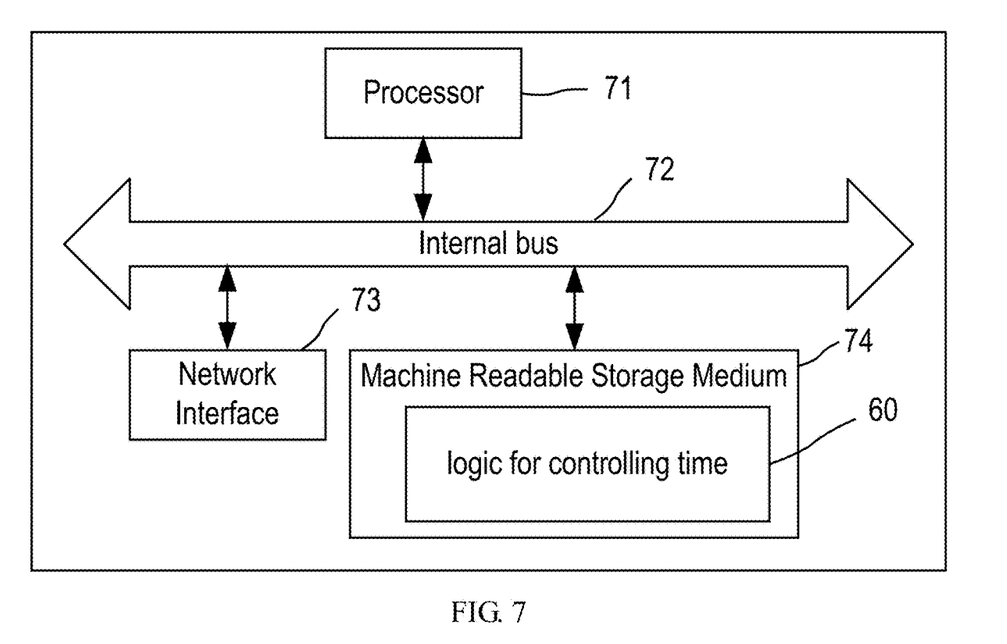
FIG. 7 is a schematic diagram illustrating a hardware structure of a nuclear magnetic resonance device according to an example of the present disclosure.

FIG. 7 is a schematic diagram illustrating an example hardware structure of a nuclear magnetic resonance device or an electronic device with a processor, which includes a logic 60 for correcting time according to the present disclosure. The logic 60 can be the logic of FIG. 6, including the transmission time delay obtaining module 601, the time correction value determining module 602, and the correcting module 603.

As shown in FIG. 7, the nuclear magnetic resonance device or the electronic device with the processor includes a processor 71, an internal bus 72, a network interface 73 and a machine readable storage medium 74. Further, the nuclear magnetic resonance device or the electronic device with the processor may further include other hardware according to functions of the device, which is not repeatedly described herein.

In the device, the processor 71 may execute a method of correcting time described above by reading and executing machine executable instructions corresponding to the logic 60 of correcting time and stored in the machine readable storage medium 74.

Logic instructions 60 corresponding to a method of correcting time may be stored in the machine readable storage medium 74. For example, the machine readable storage medium 74 may be a non-volatile memory. The processor 71 and the machine readable storage medium 74 may communicate with each other via an internal bus 72. The processor 71 may execute the above method of correcting time by invoking and executing logic instructions stored in the machine readable storage medium 74.

When functions of the logic instructions corresponding to the method of correcting time are implemented in a form of software function modules as well as sold and used as an independent product, the instructions may be stored in a computer readable storage medium. Based on the understanding above, a part of the technical solutions of the present disclosure which makes a contribution to the prior art or a part of the technical solutions may be embodied in a form of a software product, where the computer software product is stored in a storage medium and includes a plurality of instructions which causes a computer device (which may be a personal computer, a server, or a network device, etc.) to execute all or part of method blocks described in examples of the present disclosure. The storage medium above includes different mediums capable of storing program codes such as a USB flash disk, a mobile hard disk drive, a Random-Only Memory (ROM), a Random Access Memory (RAM), a magnetic disk or an optical disk.

When elements of different examples of the present disclosure are described, articles "a/an", "one", "this" and "said" are all intended to represent one or more elements. The terms "includes/including" and "has/have/having" are all inclusive and imply that there may be other elements apart from the listed elements.

It needs to be noted that any person of ordinary skill in the art will understand that the implementation of all or part of the flow in the above method embodiment may be accomplished by means of related hardware instructed by a computer program, and the program may be stored in a computer readable storage medium and may include the flow of each method example as described above when being executed, where the storage medium may be a magnetic disk, an optical disk, a Random-Only Memory (ROM), a Random Access Memory (RAM), or the like.

Each embodiment in the present disclosure is described progressively. The same or similar parts of different embodiments may be referred to one another, and the description of the differences of each embodiment from other embodiments is emphasized. In particular, since the device embodiment substantially corresponds to the method embodiment, a reference may be made to part of the descriptions of the method embodiment for the related part. The device embodiment described above is merely illustrative, where the units described as separate members may be or not be physically separated. In addition, part or all of the units and modules may be selected according to actual requirements to implement the objectives of the solutions of the embodiments. Those of ordinary skill in the art may understand and carry out them without paying creative work.

The above are descriptions of the specific embodiments of the present disclosure. It should be noted that any person of ordinary skill in the related art may numerous improvements and modifications without departing from the principle of the present disclosure, and these improvements and modifications should also be encompassed in the scope of protection of the present disclosure. Accordingly, other embodiments are within the scope of the following claims.

The invention claimed is:

1. A method of correcting time in a nuclear magnetic resonance device, the method comprising:
   obtaining, by one or more processors in the nuclear magnetic resonance device, respective transmission time delays of three gradient pulse signals generated by a three-dimensional gradient subsystem of the nuclear magnetic resonance device, wherein the three gradient pulse signals comprise a slice-selection gradient signal, a phase-encoding gradient signal, and a frequency-encoding gradient signal;
   determining, by the one or more processors, a time correction value according to the obtained respective transmission time delays of the three gradient pulse signals; and
   correcting, by the one or more processors and according to the determined time correction value, a respective output time of each of the three gradient pulse signals, an output time of a radio-frequency (RF) pulse signal generated by a RF transmitting subsystem of the nuclear magnetic resonance device, and a reception time of a magnetic resonance signal received by a RF receiving subsystem in a scanning cycle.

2. The method according to claim 1, wherein obtaining the transmission time delays of the gradient pulse signals comprises:
   for each of the gradient pulse signals,
      determining a theoretical time of a central point of the magnetic resonance signal on an assumption that the transmission time delay of the gradient pulse signal is zero;
      acquiring an actual time of the central point of the magnetic resonance signal obtained by performing scanning according to the gradient pulse signal; and
      determining a difference between the actual time and the theoretical time to be the transmission time delay of the gradient pulse signal.

3. The method according to claim 2, wherein, in the scanning cycle, the radio frequency pulse signal comprises a 90-degree RF pulse signal and a 180-degree RF pulse signal,
   wherein determining the theoretical time of the central point of the magnetic resonance signal comprises:
      obtaining a first output time of the 90-degree RF pulse signal and a second output time of the 180-degree RF pulse signal;
      calculating a time difference between the first output time of the 90-degree RF pulse signal and the second output time of the 180-degree RF pulse signal; and
      determining the theoretical time of the central point of the magnetic resonance signal according to the output time of the 180-degree RF pulse signal and the time difference.

4. The method according to claim 1, wherein determining the time correction value according to the transmission time delays of the respectively gradient pulse signals comprises:
   selecting a largest transmission time delay from the transmission time delays of the three respective gradient pulse signals as the time correction value.

5. The method according to claim 1, wherein determining the time correction value according to the transmission time delays of the respectively gradient pulse signals comprises:
   selecting a smallest transmission time delay from the transmission time delays of the three respective gradient pulse signals as the time correction value.

6. The method according to claim 1, wherein determining the time correction value according to the transmission time delays of the respectively gradient pulse signals comprises:
   weighting the transmission time delays of the three respective gradient pulse signals according to preset coefficients;
   obtaining a weighted value by adding together the weighted transmission time delays; and
   taking the weighted value as the time correction value.

7. A system for correcting time in a nuclear magnetic resonance device, comprising:
   one or more processors; and
   a non-transitory computer-readable storage medium having instructions stored thereon which, when executed by the one or more processors, cause the one or more processors to perform actions including:
      obtaining respective transmission time delays of three gradient pulse signals generated by a three-dimensional gradient subsystem of the nuclear magnetic resonance device, wherein the three gradient pulse signals comprise a slice-selection gradient signal, a phase-encoding gradient signal, and a frequency-encoding gradient signal;
      determining a time correction value according to the obtained respective transmission time delays of the three gradient pulse signals; and
      correcting, according to the determined time correction value, a respective output time of each of the three gradient pulse signals, an output time of a radio-frequency (RF) pulse signal generated by a RF transmitting subsystem of the nuclear magnetic resonance device, and a reception time of a magnetic resonance signal received by a RF receiving subsystem in a scanning cycle.

8. The system according to claim 7, wherein obtaining respective transmission time delays of the three gradient pulse signals comprises:
   for each of the gradient pulse signals,
      determining a theoretical time of a central point of the magnetic resonance signal on an assumption that the transmission time delay of the gradient pulse signal is zero;
      acquiring an actual time of the central point of the magnetic resonance signal obtained by performing scanning according to the gradient pulse signal; and
      determining a difference between the actual time and the theoretical time to be the transmission time delay of the gradient pulse signal.

9. The system according to claim 8, wherein, in the scanning cycle, the RF pulse signal comprises a 90-degree RF pulse signal and a 180-degree RF pulse signal, wherein determining the theoretical time of the central point of the magnetic resonance signal comprises:
obtaining a first output time of the 90-degree RF pulse signal and a second output time of the 180-degree RF pulse signal;
calculating a time difference between the first output time of the 90-degree RF pulse signal and the second output time of the 180-degree RF pulse signal; and
obtaining the theoretical time of the central point of the magnetic resonance signal according to the output time of the 180-degree RF pulse signal and the time difference.

10. The system according to claim 7, wherein determining the time correction value according to the transmission time delays of the respectively gradient pulse signals comprises:
selecting a largest transmission time delay from the transmission time delays of the three respective gradient pulse signals as the time correction value.

11. The system according to claim 7, wherein determining the time correction value according to the transmission time delays of the respectively gradient pulse signals comprises:
selecting a smallest transmission time delay from the transmission time delays of the three respective gradient pulse signals as the time correction value.

12. The system according to claim 7, wherein determining the time correction value according to the transmission time delays of the respectively gradient pulse signals comprises:
weighting the transmission time delays of the three respective gradient pulse signals according to preset coefficients;
obtaining a weighted value by adding together the weighted transmission time delays; and
taking the weighted value as the time correction value.

13. A non-transitory computer-readable storage medium having instructions stored thereon which, when executed by one or more processors, cause the one or more processors to perform a method of correcting time in nuclear magnetic resonance device, the method comprising:
obtaining respective transmission time delays of three gradient pulse signals generated by a three-dimensional gradient subsystem of the nuclear magnetic resonance device, wherein the three gradient pulse signals comprise a slice-selection gradient signal, a phase-encoding gradient signal, and a frequency-encoding gradient signal;
determining a time correction value according to the obtained respective transmission time delays of the three gradient pulse signals; and
correcting, according to the determined time correction value, a respective output time of each of the three gradient pulse signals, an output time of a radio-frequency (RF) pulse signal generated by a RF transmitting subsystem of the nuclear magnetic resonance device, and a reception time of a magnetic resonance signal received by a RF receiving subsystem in a scanning cycle.

14. The non-transitory computer-readable storage medium according to claim 13, wherein obtaining the transmission time delays of the gradient pulse signals comprises:
for each of the gradient pulse signals,
determining a theoretical time of a central point of the magnetic resonance signal on an assumption that the transmission time delay of the gradient pulse signal is zero;
acquiring an actual time of the central point of the magnetic resonance signal obtained by performing scanning according to the gradient pulse signal; and
determining a difference between the actual time and the theoretical time to be the transmission time delay of the gradient pulse signal.

15. The non-transitory computer-readable storage medium according to claim 14, wherein, in the scanning cycle, the radio frequency pulse signal comprises a 90-degree RF pulse signal and a 180-degree RF pulse signal,
wherein determining the theoretical time of the central point of the magnetic resonance signal comprises:
obtaining a first output time of the 90-degree RF pulse signal and a second output time of the 180-degree RF pulse signal;
calculating a time difference between the first output time of the 90-degree RF pulse signal and the second output time of the 180-degree RF pulse signal; and
determining the theoretical time of the central point of the magnetic resonance signal according to the output time of the 180-degree RF pulse signal and the time difference.

16. The non-transitory computer-readable storage medium according to claim 13, wherein determining the time correction value according to the transmission time delays of the respectively gradient pulse signals comprises one of:
selecting a largest transmission time delay from the transmission time delays of the three respective gradient pulse signals as the time correction value, and
selecting a smallest transmission time delay from the transmission time delays of the three respective gradient pulse signals as the time correction value.

17. The non-transitory computer-readable storage medium according to claim 13, wherein determining the time correction value according to the transmission time delays of the respectively gradient pulse signals comprises:
weighting the transmission time delays of the three respective gradient pulse signals according to preset coefficients,
obtaining a weighted value by adding together the weighted transmission time delays;
taking the weighted value as the time correction value.

18. The method of claim 1, wherein the correcting comprises:
delaying the respective output times of the three gradient pulse signals based on first delays in a first delay signal received by the three-dimensional gradient subsystem, the first delays comprising a delay determined based on the determined time correction value and the respective transmission time delay of the slice-selection gradient signal, a delay determined based on the determined time correction value and the respective transmission time delay of the phase-encoding gradient signal, and a delay determined based on the determined time correction value and the respective transmission time delay of the frequency-encoding gradient signal,
delaying the output time of the RF pulse signal based on a second delay in a second delay signal received by the RF transmitting subsystem, the second delay being determined based on the determined time correction value, and
delaying the reception time of the magnetic resonance signal based on a third delay in a third delay signal received by the RF receiving subsystem, the third delay being determined based on the determined time correction value.

19. The system according to claim 7, wherein the correcting comprises:

delaying the respective output times of the three gradient pulse signals based on first delays in a first delay signal received by the three-dimensional gradient subsystem, the first delays comprising a delay determined based on the determined time correction value and the respective transmission time delay of the slice-selection gradient signal, a delay determined based on the determined time correction value and the respective transmission time delay of the phase-encoding gradient signal, and a delay determined based on the determined time correction value and the respective transmission time delay of the frequency-encoding gradient signal, delaying the output time of the RF pulse signal based on a second delay in a second delay signal received by the RF transmitting subsystem, the second delay being determined based on the determined time correction value, and delaying the reception time of the magnetic resonance signal based on a third delay in a third delay signal received by the RF receiving subsystem, the third delay being determined based on the determined time correction value.

20. The non-transitory computer-readable storage medium according to claim 13, wherein the correcting comprises:

delaying the respective output times of the three gradient pulse signals based on first delays in a first delay signal received by the three-dimensional gradient subsystem, the first delays comprising a delay determined based on the determined time correction value and the respective transmission time delay of the slice-selection gradient signal, a delay determined based on the determined time correction value and the respective transmission time delay of the phase-encoding gradient signal, and a delay determined based on the determined time correction value and the respective transmission time delay of the frequency-encoding gradient signal, delaying the output time of the RF pulse signal based on a second delay in a second delay signal received by the RF transmitting subsystem, the second delay being determined based on the determined time correction value, and delaying the reception time of the magnetic resonance signal based on a third delay in a third delay signal received by the RF receiving subsystem, the third delay being determined based on the determined time correction value.

* * * * *